(12) United States Patent
Bell

(10) Patent No.: US 7,906,994 B2
(45) Date of Patent: Mar. 15, 2011

(54) FAST COMMON MODE FEEDBACK CONTROL FOR DIFFERENTIAL DRIVER

(75) Inventor: Marshall J. Bell, Dripping Springs, TX (US)

(73) Assignee: Standard Microsystems Corporation, Hauppauge, NY (US)

( * ) Notice: Subject to any disclaimer, the term of this patent is extended or adjusted under 35 U.S.C. 154(b) by 61 days.

(21) Appl. No.: 12/391,414

(22) Filed: Feb. 24, 2009

(65) Prior Publication Data
US 2010/0213985 A1 Aug. 26, 2010

(51) Int. Cl.
*H03K 3/00* (2006.01)
(52) U.S. Cl. ............................................. 327/108
(58) Field of Classification Search ............... None
See application file for complete search history.

(56) References Cited

U.S. PATENT DOCUMENTS

| | | | |
|---|---|---|---|
| 5,381,112 A | 1/1995 | Rybicki et al. | |
| 6,946,907 B2 | 9/2005 | Tai | |
| 7,352,207 B2 | 4/2008 | Garlapati et al. | |
| 7,514,972 B2 * | 4/2009 | Dvorak et al. | 327/157 |
| 7,564,306 B2 | 7/2009 | Lee et al. | |
| 7,609,097 B2 * | 10/2009 | Leonowich et al. | 327/108 |
| 7,675,330 B2 * | 3/2010 | Chen et al. | 327/108 |
| 7,696,793 B2 * | 4/2010 | Sunairi | 327/108 |
| 2003/0085736 A1 | 5/2003 | Tinsley et al. | |
| 2007/0024320 A1 | 2/2007 | de Laurentiis et al. | |
| 2007/0279105 A1 | 12/2007 | Sunairi | |
| 2008/0136464 A1 * | 6/2008 | Kim et al. | 327/108 |
| 2008/0238521 A1 | 10/2008 | Huang | |
| 2009/0261866 A1 * | 10/2009 | Shibata | 327/108 |
| 2010/0127736 A1 * | 5/2010 | Dixit et al. | 327/108 |

OTHER PUBLICATIONS

International Search Report and Written Opinion for Application No. PCT/US2010/025208, mailed May 7, 2010.
Edgar Sánchez-Sinencio; "Common-Mode Feedback Techniques: A Tutorial"; Texas A&M University; Feb. 2005; 46 pages.

* cited by examiner

*Primary Examiner* — Lincoln Donovan
*Assistant Examiner* — Khareem E Almo
(74) *Attorney, Agent, or Firm* — Meyertons Hood Kivlin Kowert & Goetzel, P.C.; Rory D. Rankin

(57) ABSTRACT

A system and method for a fast stabilizing output buffer. A differential driver circuit is provided with an amplifier stage for receiving a differential input signal and generating a differential output based upon the input signal. The differential output has a corresponding common-mode (CM) voltage level typically based upon a value half of the power supply. A common-mode feedback buffer (CMFB) stage detects a change in the CM voltage level and recovers the CM voltage level to its desired value within a very fast settling time based upon a very high bus frequency. The CMFB stage utilizes a topology comprising only a single device. In one embodiment, this single device is a nmos transistor utilized as a transimpedance stage. Stability is provided by a circuit biasing stage and a shunting capacitor within the CMFB stage.

20 Claims, 3 Drawing Sheets

FAST COMMON MODE FEEDBACK CONTROL FOR DIFFERENTIAL DRIVER

BACKGROUND OF THE INVENTION

1. Field of the Invention

This invention relates to electronic circuits, and more particularly, to an efficient method for a fast stabilizing output buffer.

2. Description of the Relevant Art

Very high-speed networks and computer buses continue to increase demand for bandwidth. By utilizing differential signaling, high-speed serial bus architectures are improving in order to satisfy this demand. Differential signaling electrically transmits information by means of two complementary signals sent on two separate wires. This technique can be used for both analog signaling, such as audio signal transmission, and digital signaling, such as within a Peripheral Component Interconnect (PCI) Express serial link interface and Universal Serial Bus (USB) interface.

One advantage of differential signaling includes a tolerance of ground potential differences between a transmitter and a receiver, since a receiver interface reads the difference between the two transmitted data signals and is not affected by the wires' voltages with respect to ground. Also, differential signaling is used with low voltages of mobile electronic devices since it provides twice the noise immunity of a single-ended system. Differential signaling helps to reduce the number of wire routes, or signal traces, and helps to reduce power consumption.

Differential signals are driven between a transmitter and a receiver by a differential amplifier, or differential driver, comprising a differential pair. If the input devices on a complementary metal oxide semiconductor (CMOS) differential pair are all nmos transistors, and the loads are either inductors or resistors, then a common-mode feedback buffer (CMFB), or loop or amplifier, is unnecessary. A CMFB is not required in this case, since the output resistance of this type of differential pair is weighted down by the low resistance of the inductor or resistors.

However, if a high-impedance transconductor, such as a nmos or a pmos transistor, is loaded with a high-impedance current source, such as a pmos or a nmos transistor, respectively, then a CMFB becomes necessary. Small differences between the bias current of the transconductor and the bias current of the load can induce large swings in voltage when multiplied by the high resistance of the output node.

In order to obtain a stable and predictable output signal, first, the CMFB needs to center the common mode output signal to a fixed but arbitrary chosen reference voltage. For maximal output voltage swing, a value that is half of the supply voltage is preferred. Second, the bandwidth of the CMFB has to be greater than the bandwidth of the differential amplifier. This requirement ensures the differential amplifier has a predictable and stable output response even with high frequency input signals. Third, the common mode input voltage range of the CMFB needs to be greater than the differential output range of the differential amplifier. And, fourth, the differential input range of the CMFB has to be greater than the differential output range of the differential amplifier.

Prior communication bus protocols utilizing Low Voltage Differential Signaling (LVDS) require an enabled CMFB to settle within hundreds of microseconds. Newer bus architectures utilizing similar techniques as LVDS require higher frequencies on the bus. Therefore, the CMFB is required to settle at a faster rate, such as a few nanoseconds, in order to maintain the corresponding differential data rate. This new settle time requirement for the CMFB is not met by current designs. The typical much slower settling times help eliminate signal stability problems. In order to maintain current circuit topologies, substantial power may need to be used to reach the new speeds. However, the bandwidth will be limited and stability issues arise with the unknown loads that can be coupled to the output.

In view of the above, efficient methods and systems for a fast stabilizing output buffer are desired.

SUMMARY OF THE INVENTION

Systems and methods for a fast stabilizing output buffer. In one embodiment, a differential driver circuit is provided with an amplifer stage for receiving a differential input signal and generating a differential output based upon the input signal. The differential output has a corresponding common-mode (CM) voltage level based upon a predetermined reference CM voltage level. A common-mode feedback buffer (CMFB) stage detects a change in the CM voltage level from the predetermined reference CM voltage level and recovers the CM voltage level to the reference CM voltage level within a very fast settling time based upon a predetermined high bus frequency. The CMFB stage utilizes a topology comprising only a single device. In one embodiment, this single device is an nmos transistor utilized as a transimpedance stage. Other embodiments may utilize a single pmos transistor or a single bipolar junction transistor. Stability is provided by a circuit biasing stage and a shunting capacitor within the CMFB stage.

Also contemplated is a method to very quickly provide serial data on a communication bus. Differential output data is conveyed on the bus with an associated common-mode (CM) voltage level typically half of the value of the power supply. The method comprises detecting a change in the CM voltage level and recovering the CM voltage level to its desired value within a recovery time corresponding to a predetermined high bus frequency. This frequency may be a couple hundred megahertz (MHz).

These and other embodiments will be appreciated upon reference to the following description and accompanying figures.

Figure 1:
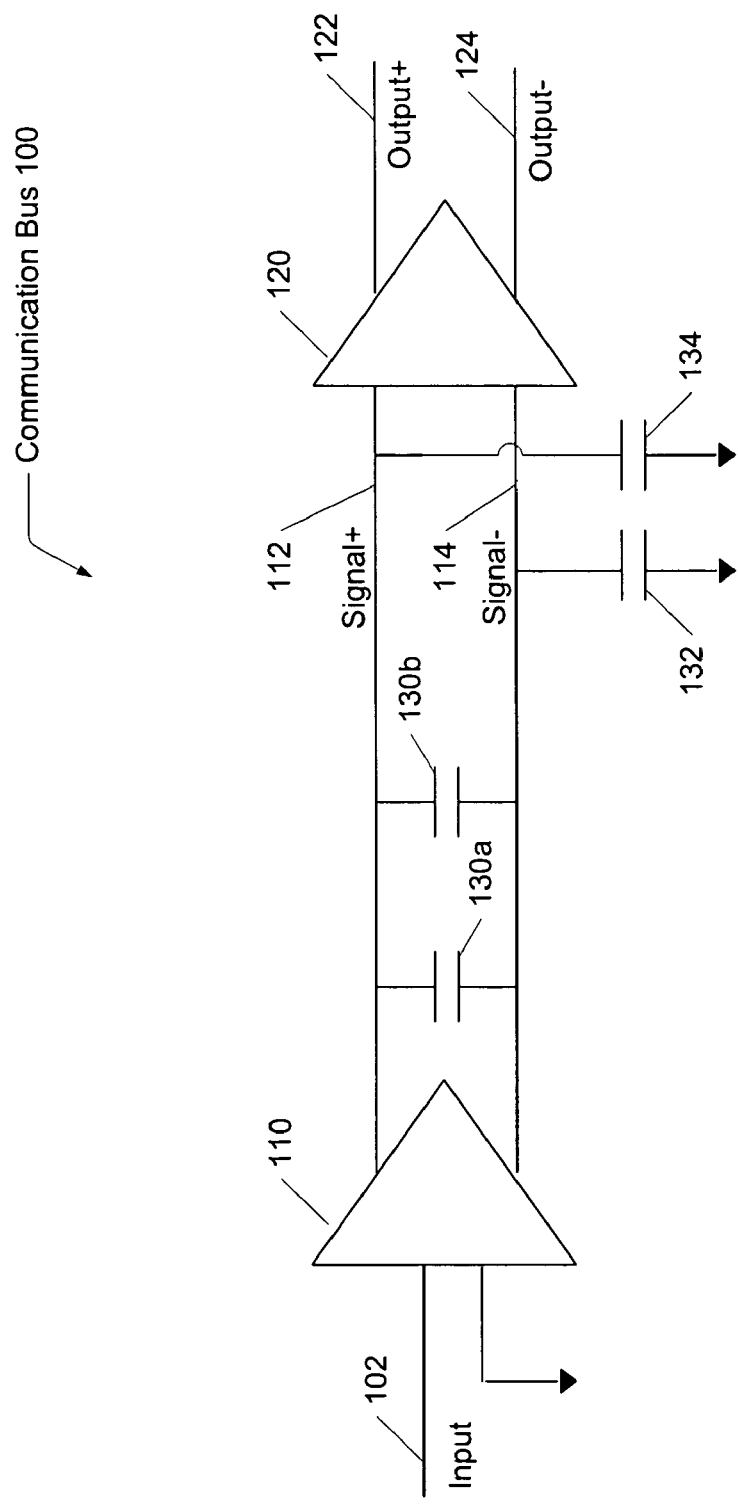
FIG. 1 is a generalized diagram illustrating one embodiment of a communication bus utilizing differential signals.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Referring to FIG. 1 one embodiment of a communication bus 100 utilizing differential signals is shown. This embodiment does not include all examples of functional blocks, control logic, circuitry, and interfaces required both within and outside transmitter 110 and receiver 120. The embodiment shown is for a simple illustrative purpose.

An alternative to a common ground signal method is a differential voltage signal method, wherein each bit is represented by the difference of voltage levels between a ground-isolated pair of wires, such as the first pair signal+ 112 and signal– 114 and the second pair output+ 122 and output– 124. Communication bus 100 does not utilize a voltage between one wire and a common ground. A parallel to serial port signal converter may feed the input signal 102. Circuitry referred to as a Serializer/Deserializer (SerDes) may be used to supply input data on inputs signal 102. SerDes is a pair of functional blocks commonly used in high speed communications. These blocks convert data between serial data and parallel interfaces in each direction. The differential signal method may limit both the capacitive and inductive effects imposed upon each signal and the tendency for the signals to be corrupted due to outside electrical interference, thereby significantly improving the practical distance of a serial network.

Transmitter 110 may comprise a differential amplifier in order to drive a differential voltage signal between signal+ 112 and signal– 114. Similarly, receiver 120 may comprise a differential amplifier in order to drive a differential voltage signal between output+ 122 and output– 124. The signal routes 112, 114, 122, and 124 may not be electrically common with a ground reference.

Having eliminated any relation between a voltage signal and ground on these lines, the only significant capacitance imposed on the signal voltage may be the cross-coupled capacitance existing between the two signal wires, such as capacitors 130a-130b. As used herein, elements referred to by a reference numeral followed by a letter may be collectively referred to by the numeral alone. For example, capacitors 130a-130d may be collectively referred to as capacitors 130. Capacitance between a signal wire and a ground reference now may be of much less effect, because the capacitive path between the two signal wires via a ground reference is two capacitances in series. For example, a path from signal+ 112 to ground reference includes capacitor 134. Then a continued path from ground reference to signal– 114 includes capacitor 132. This path includes the series combination of capacitors 132 and 134 and series capacitive values are always less than any of the individual capacitances.

Furthermore, any noise voltage induced between the signal wires 112 and 114 and ground reference by an external source may be ignored. The reason for this is that noise voltage likely may be induced on both signal wires 112 and 114 in equal measure, and receiver 120 may only respond to the differential voltage between signals 112 and 114, rather than the voltage between either signal+ 112 or signal– 114 and ground reference. Communication bus 100 may be more widely used in networks than a common ground reference method in industrial applications where longer wiring distances and greater potential for electrical interference from AC power wiring exists.

Design parameters used to provide a high frequency protocol on signals 112 and 114 may need to standardized in order to be useful for a wide range of applications. The Open Systems Interconnection Reference Model, or OSI Model, is an abstract description for layered communications and computer network protocol design. It was developed as part of the Open Systems Interconnection (OSI) initiative. In its most basic form, it divides network architecture into seven layers which, from top to bottom, are the Application, Presentation, Session, Transport, Network, Data-Link, and Physical Layers.

A layer is a collection of conceptually similar functions that provide services to the layer above it and receives service from the layer below it. For example, a layer that provides error-free communications across a network provides the path needed by applications above it, while it calls the next lower layer to send and receive packets that make up the contents of the path.

The Physical Layer defines the electrical and physical specifications for devices. In particular, it defines the relationship between a device and a physical medium. This may include the layout of pins, voltages, cable specifications, Hubs, repeaters, network adapters, or other.

The Data Link Layer provides the functional and procedural means to transfer data between network entities and to detect and possibly correct errors that may occur in the Physical Layer. The Network Layer provides the functional and procedural means of transferring variable length data sequences from a source to a destination via one or more networks, while maintaining the quality of service requested by the Transport Layer.

Newer network architectures for communication bus 100 may be developing to satisfy demands for higher frequencies and higher throughput of data. For example, one implementation, Media Local Bus (MLB) offered by Standard Microsystems Corp., is developed for the Physical Layer and the Link Layer. MLB is an on-printed-circuit-board (on-PCB) or inter-chip communication bus, specifically designed to standardize a common hardware interface and software application programming interface (API) library. This standardization may allow one or more applications to access network data, or to communicate with other applications, with minimum effort. MLB is also designed to provide a simple migration path from existing network architectures to next-generation architectures. MLB supports all network data transport methods including synchronous stream data, asynchronous packet data, control message data, and isochronous data transport.

Network bandwidth refers to the practical frequency limit of a network medium. In serial communication, bandwidth may be a product of data volume, such as binary bits per transmitted word and data speed, or words per second. The standard measure of network bandwidth is bits per second, or bps.

Because serial data requires the transmission of all data bits through the same wiring channel, such as in one embodiment signal+ 112, from transmitter 110 to receiver 120, it necessitates a potentially high frequency signal on the network wiring. Both data, such as 32 bits or 64 bits depending on the word size, and other bits necessary for parity checking and signal synchronization may be updated at a rate of thousands of times per second. Serial data network frequencies start to enter the radio range, and simple wires begin to act as antennas, pairs of wires as transmission lines, due to inductive and capacitive reactances. These parasitic characteristics may distort and slow down signal transmissions.

The higher speed requirements of newer network architectures as described earlier offer design challenges such as meeting these higher frequencies without appreciably sacrificing stability. Particularly, the design of the differential driver with a common-mode feedback buffer (CMFB) may require the greatest attention. For example, in addition to the higher speed parasitic characteristics, the signal lines 112 and 114, in one embodiment, may be coupled to multiple drivers, or transmitters 110. A particular transmitter 110 may be waiting to drive signals onto lines 112 and 114, and, therefore, circuitry within at least a CMFB stage is turned off in order to provide a tri-state output. Upon receiving permission to drive a differential output on lines 112 and 114, the circuitry within at least the CMFB stage of this particular transmitter 110 may need a very quick response from the time of being enabled to a time of reaching a settled state, such as providing a common-mode voltage level for signal lines 112 and 114. In one embodiment, this fast response, due to newer network architectures, may be reduced from previous values of hundreds of microseconds to only a few nanoseconds.

Figure 2:
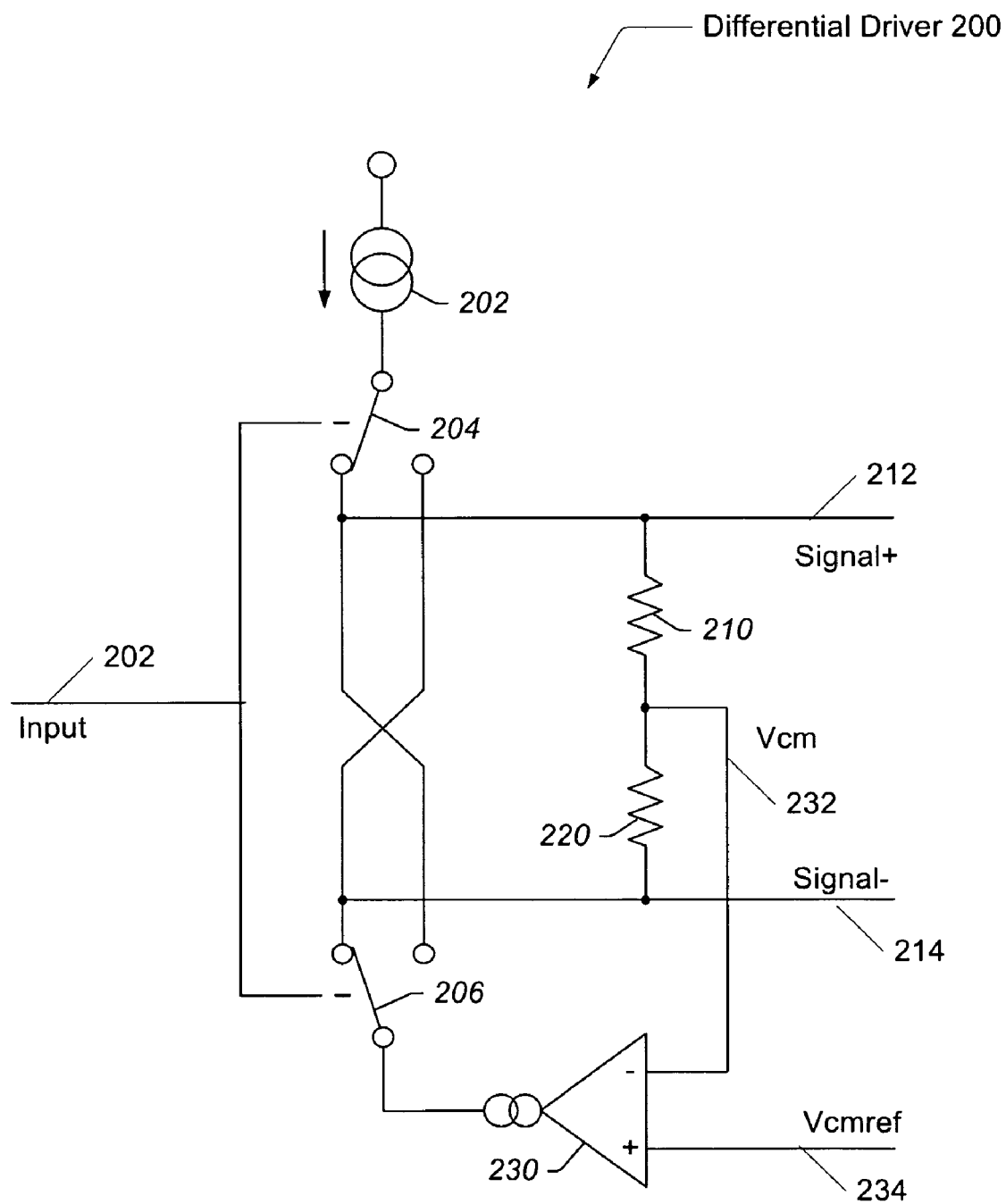
FIG. 2 is a generalized diagram illustrating one embodiment of a differential driver with common mode feedback.

Turning now to FIG. 2, one embodiment of a generalized diagram of a differential driver 200 with common mode feedback is shown. Referring again to FIG. 1, driver 200 may be utilized within the output circuitry of transmitter 110 or receiver 120. The simplified diagram of driver 200 may be implemented by many known circuit topologies and techniques as known to those skilled in the art. In one embodiment, a reference common-mode voltage signal, Vcmref 234, is supplied to feedback amplifier 230. Also, the voltage level at a common-mode node, such as Vcm 232, may be supplied to feedback amplifier 230. The common-mode node is between two series resistors 210 and 220 that may have the same value such as 1 kohm in one embodiment. A current source 202 supplies current to corresponding circuitry and may be implemented by a current mirror or other topology. Input signal 202 may be used to determine which nodes are supplied with current from source 202 via switches 204 and 206, which may be implemented by known transistor topologies.

In prior designs the common mode feedback loop, or CMFB, formed by amplifier 230, resistor 210, and resistor 220 was designed to be much slower than the differential data rate on output lines 212 and 214, which helps to eliminate many stability issues. Typical settling times measured from the time driver 200 is enabled to the time node 232 settles to a predetermined common-mode voltage level, are in the hundreds of microseconds.

However, newer communication bus architectures, such as the MLB briefly described above, require much faster speeds from the CMFB such as a settling time within 5 nanoseconds. For example, driver 200 controls the common mode voltage on the lines 212 and 214, or the bus, via the CMFB and when enabled the CMFB needs to settle within 5 ns. The previous circuits for the feedback amplifier 230 typically requires 5 or more transistors, which is an appreciable footprint in the driver design. Also, unless substantial power is used in current implementations of the feedback amplifier 230, its bandwidth will be limited and stability issues arise with the unknown loads that can be attached to the output.

Figure 3:
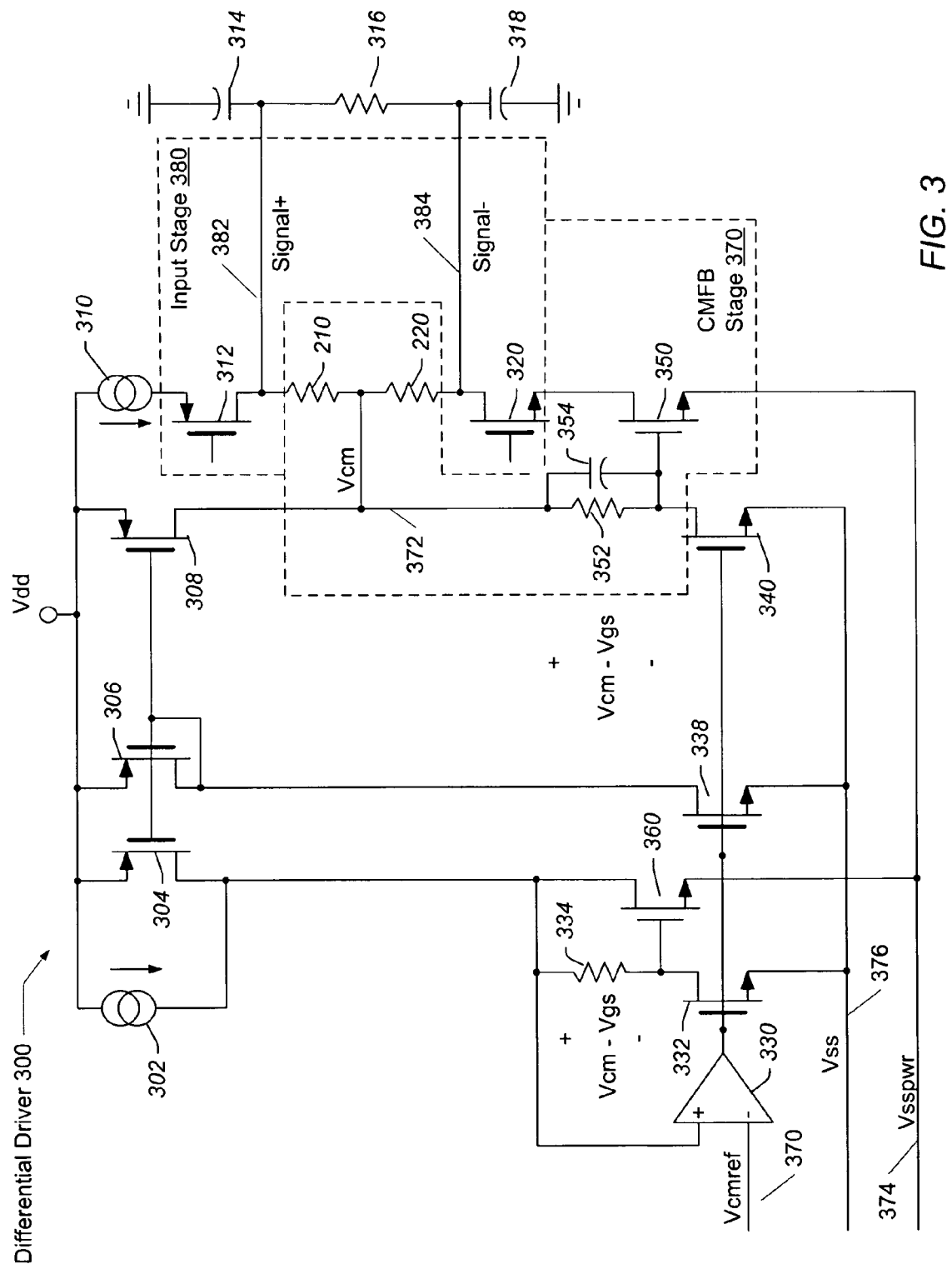
FIG. 3 is a generalized diagram illustrating one embodiment of a differential driver with common-mode feedback for high-speed differential data rates.

Referring now to FIG. 3, one embodiment of a differential driver 300 with common-mode feedback for high-speed differential data rates is shown. Referring again to FIG. 1, driver 300 may be utilized within the output circuitry of transmitter 110 or receiver 120. An input, or amplifier, stage 380, which also acts as a driver stage, comprises pmos transistor 312 and nmos transistor 320. Transistors 312 and 320 both receive an input signal, which may be a differential input signal, and generate a differential output on lines 382 and 384. In one embodiment, transistors 312 and 320 may be one half of a H-bridge, wherein the other half is not shown for ease of illustrative purposes and an H-bridge is well known to those skilled in the art. A common-mode feedback buffer (CMFB) stage 370 comprises nmos transistor 350 configured as a transimpedance stage, resistor 352 and capacitor 354 on the gate terminal of transistor 350, and resistors 210 and 220.

The remainder of the circuitry of driver 300 may be used for biasing and stability purposes. Current sources 302 and 310 may be implemented by any topology known by those skilled in the art. These current sources and pmos transistor 304 and the current mirror implemented by pmos transistors 306 and 308 provide predetermined current values to the circuitry below. The current values supplied by the output drains of pmos transistors 306 and 308 may be an integer multiple on one another based on the sizing, such as the transistor width, of these transistors. In one embodiment, pmos transistor may be 4 times the width of pmos transistor 306, and, thus, pmos transistor 308 supplies 4 times more current than transistor 306.

In order to obtain a fast response required by a very high-speed network bus architecture, such as the MLB specification, a single device transimpedance stage may be used to control the common-mode voltage. In one embodiment, a single device transimpedance stage utilizes a single nmos transistor, such as transistor 350. In another embodiment, a pmos transistor or a bipolar junction transistor may be utilized. In other embodiments, other single transistor configurations may be utilized to provide a fast reponse required by a high-speed network bus architecture. The combination of nmos transistor 350 and resistors 210 and 220 provide the CMFB circuitry for driver 300. When enabled, the gate terminal of nmos transistor 350 senses the common-mode voltage, Vcm 372, at the center of resistors 210 and 220 through a series resistor 352.

The voltage potential at the gate terminal of transistor 350 is maintained at the gate-to-source turn-on voltage, Vgs, of transistor 350. However, this Vgs value may not be the desired common-mode voltage for driver 300. Therefore, a replica circuit may be used to attempt to provide the desired common-mode voltage level, Vcmref 370, at the center of resistors 210 and 220. Note that there may be a slight variation from this value, and, therefore, this node voltage is represented as Vcm 372. In one embodiment, the replica circuit comprises the combination of nmos transistor 360, current sinks 332, 338, and 340; and current sources 304, 306, and 308. This replica circuit may be used to generate sufficient current through series resistor 352 in order to create a voltage drop that provides the voltage level Vcm 372 at the node between resistors 210 and 220.

This replica circuit produces a direct current and does not require a fast response. Therefore, the replica circuit may be implemented by a well know classical voltage feedback topology. Transistors 360 and 350 may need to match one another such as having very similar geometric width and channel length, turn-on threshold voltage level, and other. Note that the ground reference return for the matched transistors 350 and 360 are separated from the ground reference for the current sinks 332, 338, and 340. Transistors 350 and 360 utilizes ground reference Vsspwr 374 and the current sinks utilize ground reference Vss 376.

The current through transistor 350 may reach a very high amount, such as a few milliamperes, which may produce a significant voltage drop to the ground pin Vsspwr 374. The current mirror, comprising pmos transistors 306 and 308, in combination with pmos transistor 304 may subsequently increase the amount of current drawn and the drain terminal of transistor 360 may experience both a voltage and current increase. Therefore, the significant voltage drop to the ground pin Vsspwr 374 produced by transistor 350 may be sensed by transistor 360. Accordingly, the voltage drop across resistor 334 may increase, single-ended differential amplifier 330 may output a voltage larger than the Vgs value of the nmos transistors in driver 300, and current sink 340 may turn on stronger and draw more current. Then the voltage drop across resistor 352 may increase and thereby the voltage level at Vcm 232 may decrease and return to a value similar to the desired common-mode voltage level Vcmref 370 referenced to the node Vss 376. This compensation may take longer than the enable time for the CMFB, which may be a few nanoseconds, but the error is appreciably small, such as in the range of 20 mV.

Ideally, amplifiers have a near-constant gain for a given frequency range and the gain rolls off at higher frequencies. Transient and frequency response of feedback amplifiers are related to a pole location characteristic of the amplifier in question. Non-ideal amplifiers typically have more than one pole. The negative feedback provided by the replica circuit of driver 300 may require frequency compensation in order to avoid the unintentional creation of positive feedback, which will cause driver 300 to oscillate, and to control overshoot and ringing.

A pole is the point in a frequency response curve where the amplitude decreases by 3 db due to an integrating resistance and capacitive reactance. Ultimately, each pole will result in a phase lag of 90°, or the output signal will lag behind the input signal by 90° at this point. Capacitances within the gain stages of an amplifier cause the output signal to lag behind the input signal by 90° for each pole they create. Pole splitting is a type of frequency compensation in which a capacitor is introduced with the intention of moving the pole lowest in frequency, typically an input pole, to lower frequencies and the pole next in frequency, typically an output pole, to a higher frequency. This pole movement increases the stability of the amplifier and improves its step response at the cost of decreased speed.

Driver 300 of FIG. 3 may have two poles. One pole is partially provided by the gate-to-source parasitic capacitance of transistor 350 and a second pole is provided by capacitor 318 coupled to the output, or drain terminal of transistor 350. The placement of capacitor 354 across resistor 352 cancels the pole formed by the parasitic gate-to-source capacitance of transistor 350 and the series resistance formed by the on-state resistance of transistor 350 and resistors 352, 210, and 220. Capacitor 354 can't be connected to the center of resistors 210 and 220 since this node may be disconnected when the output is disabled and it is not desirable to have extra capacitance left on an output node.

Driver 300 may provide a high-speed settling CMFB for a differential amplifier by including a diode connected nmos transistor 350, wherein the drain terminal is connected to the gate terminal via the on-state resistance of transistor 320, resistor 220, and resistor 352. Stability for driver 300 may be provided by the described replica circuit and capacitor 354.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A differential driver circuit comprising:
    a driver stage configured to generate a differential output with an associated predetermined common-mode (CM) voltage level at a CM node; and
    a common-mode feedback buffer (CMFB) stage coupled to the driver stage, wherein the CMFB stage comprises a single transistor first stage;
    wherein the first stage is configured to:
        track voltage changes corresponding to the CM node with a gate terminal of the single transistor via a first resistor connected to the CM node and the gate terminal; and
        recover via a drain terminal of the single transistor a voltage level at the CM node to the predetermined CM voltage level; and
    wherein the CMFB stage is configured to cancel a pole formed by a gate-to-source parasitic capacitance of the single transistor with a capacitor shunting the first resistor.

2. The differential driver circuit as recited in claim 1, wherein the single transistor is a transistor having:
    a drain terminal coupled to an on-resistance of an input transistor within said driver stage, wherein the on-resistance is coupled to a second resistor coupled to said CM node; and
    a source terminal coupled to a first steady-state reference level.

3. The differential driver circuit as recited in claim 1, wherein the differential driver further comprises a bias stage comprising a replica transistor having a source terminal coupled to said first steady-state reference level, wherein the replica transistor has matching transistor characteristics of the single transistor.

4. The differential driver circuit as recited in claim 3, wherein the bias stage further comprises circuitry for current sources configured to supply a greater amount of current to the single transistor than to said replica transistor.

5. The differential driver circuit as recited in claim 4, wherein the bias stage is further configured to:
    detect via said replica transistor and said current sources a predetermined current draw threshold by the CMFB stage; and
    recover the CM node voltage level to the predetermined CM voltage level in response to detecting the predetermined current draw threshold.

6. The differential driver circuit as recited in claim 4, wherein the bias stage further comprises circuitry for current sinks coupled to a second steady-state reference level with a same reference level value but a separate reference from said first steady-state reference level.

7. The differential driver circuit as recited in claim 4, wherein the bias stage further comprises an output node for said circuitry connected to the first resistor and said gate terminal for adjusting current passing through the first resistor.

8. The differential driver circuit as recited in claim 7, wherein the CMFB stage further comprises a third resistor between a first differential signal of said differential output and said CM node and the second resistor between said CM node and the drain terminal of said input transistor, wherein the third resistor has a same impedance as said second resistor.

9. A bus communication system comprising:
    a transmitter configured to generate a differential output with an associated predetermined common-mode (CM) voltage level at a CM node;
    a receiver configured to receive the differential output; and
    a bus comprising one or more data lines coupling the differential output of the transmitter to the receiver; and
    wherein the transmitter comprises a common-mode feedback buffer (CMFB) stage comprising a single transistor first stage;
    wherein the first stage is configured to:

track voltage changes corresponding to the CM node with a gate terminal of the single transistor via a first resistor connected to the CM node and the gate terminal; and recover via a drain terminal of the single transistor a voltage level at the CM node to the predetermined CM voltage level; and wherein the CMFB stage is configured to cancel a pole formed by a gate-to-source parasitic capacitance of the single transistor with a capacitor shunting the first resistor.

10. The bus communication system as recited in claim 9, wherein the single transistor is a transistor having:

a drain terminal coupled to an on-resistance of an input transistor within said driver stage, wherein the on-resistance is coupled to a second resistor coupled to said CM node; and a source terminal coupled to a first steady-state reference level.

11. The bus communication system as recited in claim 9, wherein the differential driver further comprises a bias stage comprising a replica transistor having a source terminal coupled to said first steady-state reference level, wherein the replica transistor has matching transistor characteristics of the single transistor.

12. The bus communication system as recited in claim 11, wherein the bias stage further comprises circuitry for current sources configured to supply a greater amount of current to the single transistor said than to said replica transistor.

13. The bus communication system as recited in claim 12, wherein the bias stage is further configured to:

detect via said replica transistor and said current sources a predetermined current draw threshold by the CMFB stage; and recover the CM node voltage level to the predetermined CM voltage level in response to detecting the predetermined current draw threshold.

14. The bus communication system as recited in claim 12, wherein the bias stage further comprises circuitry for current sinks coupled to a second steady-state reference level with a same reference level value but a separate reference from said first steady-state reference level.

15. The bus communication system as recited in claim 12, wherein the bias stage further comprises an output node for said circuitry connected to the first resistor and said gate terminal for adjusting current passing through the first resistor.

16. The bus communication system as recited in claim 15, wherein the CMFB stage further comprises a third resistor between a first differential signal of said differential output and said CM node and the second resistor between said CM node and the drain terminal of said input transistor, wherein the third resistor has a same impedance as said second resistor.

17. A differential signal driving method, the method comprising:

generating a differential output with an associated predetermined common-mode (CM) voltage level at a CM node;

tracking voltage changes corresponding to the CM node with a gate terminal of a single transistor via a first resistor connected to the CM node and the gate terminal, wherein the single transistor is in a single transistor first stage within a common-mode feedback buffer (CMFB); and recovering via a drain terminal of the single transistor a voltage level at the CM node to the predetermined CM voltage level; and canceling a pole formed by a gate-to-source parasitic capacitance of the single transistor with a capacitor shunting the first resistor.

18. The method as recited in claim 17, wherein the single transistor is a transistor having:

a drain terminal coupled to an on-resistance of an input transistor within said driver stage, wherein the on-resistance is coupled to a second resistor coupled to said CM node; and a source terminal coupled to a first steady-state reference level.

19. The method as recited in claim 18, further comprising a replica transistor having a source terminal coupled to said first steady-state reference level, wherein the replica transistor has matching transistor characteristics of the single transistor.

20. The method as recited in claim 19, further comprising supplying a greater amount of current to the single transistor than to said replica transistor.

* * * * *

UNITED STATES PATENT AND TRADEMARK OFFICE
CERTIFICATE OF CORRECTION

| | |
|---|---|
| PATENT NO. | : 7,906,994 B2 |
| APPLICATION NO. | : 12/391414 |
| DATED | : March 15, 2011 |
| INVENTOR(S) | : Bell |

It is certified that error appears in the above-identified patent and that said Letters Patent is hereby corrected as shown below:

In the Claims:

Column 9
Line 30, please delete "said". (1st occurrence)

Signed and Sealed this
Thirty-first Day of May, 2011

David J. Kappos
*Director of the United States Patent and Trademark Office*